(12) United States Patent (10) Patent No.: US 9,300,462 B2
Schafferer (45) Date of Patent: Mar. 29, 2016

(54) METHODS, DEVICES, AND ALGORITHMS FOR THE LINEARIZATION OF NONLINEAR TIME VARIANT SYSTEMS AND THE SYNCHRONIZATION OF A PLURALITY OF SUCH SYSTEMS

(71) Applicant: Bernd Schafferer, Amesbury, MA (US)

(72) Inventor: Bernd Schafferer, Amesbury, MA (US)

( * ) Notice: Subject to any disclaimer, the term of this patent is extended or adjusted under 35 U.S.C. 154(b) by 0 days.

(21) Appl. No.: 14/280,574

(22) Filed: May 17, 2014

(65) Prior Publication Data

US 2014/0376676 A1 Dec. 25, 2014

Related U.S. Application Data

(60) Provisional application No. 61/825,030, filed on May 18, 2013.

(51) Int. Cl.
*H04K 1/02* (2006.01)
*H04L 25/03* (2006.01)
(Continued)

(52) U.S. Cl.
CPC ............ *H04L 7/0091* (2013.01); *H03F 1/3247* (2013.01); *H03F 3/195* (2013.01); *H03F 3/24* (2013.01); *H04B 1/0475* (2013.01);
(Continued)

(58) Field of Classification Search
CPC ... H04L 7/0091; H04L 27/367; H04L 27/368; H04L 27/00; H03F 1/3241; H03F 1/3247; H03F 3/195; H03F 3/24; H03F 2200/207; H03F 2200/204; H03F 2200/336; H03F 2201/3233; H04J 3/0685; H04B 1/0475; H04B 2001/0425

USPC .................................................. 375/296, 297
See application file for complete search history.

(56) References Cited

U.S. PATENT DOCUMENTS 6,304,140 B1  10/2001  Thron
6,339,399 B1  1/2002   Andersson
(Continued)

FOREIGN PATENT DOCUMENTS

EP          2019486 A1      1/2009
WO    WO 2014/129863 A1    8/2014

OTHER PUBLICATIONS

Sasao, Tsutomu and Butler, John T., "Numerical Function Generators Using LUT Cascades," IEEE Trans. on Computers, vol. 56, No. 6, Jun. 2007.
(Continued)

*Primary Examiner* — Phuong Phu
(74) *Attorney, Agent, or Firm* — Daniel N. Smith

(57) ABSTRACT

Methods, devices and algorithms for the linearization of non-linear time variant systems and the synchronization of a plurality of such systems. An example of such a system would be a transmit path, including the power amplifier, as used in wireless transmit systems. Advances made in CMOS technology, digital to analog converter (DAC) technology make it possible to implement a substantial part of such a system in the digital domain. Another aspect is the integration of a substantial part of such a transmit system in a single integrated circuit (IC). A digital implementation that allows for linearization of a broad range of nonlinear and time variant effects. Since this digital implementations operate a high clock frequency a energy efficient implementation is essential to keep the power consumption under control. Another aspects is the reuse of methods, devices and algorithms used for the linearization a transmit system to synchronize multiple transmit systems.

25 Claims, 12 Drawing Sheets

(51) Int. Cl.
| | |
|---|---|
| H04L 25/49 | (2006.01) |
| H04L 7/00 | (2006.01) |
| H04J 3/06 | (2006.01) |
| H04L 27/00 | (2006.01) |
| H03F 1/32 | (2006.01) |
| H03F 3/195 | (2006.01) |
| H03F 3/24 | (2006.01) |
| H04B 1/04 | (2006.01) |

(52) U.S. Cl.
CPC ............ *H04J3/0685* (2013.01); *H04L 27/00* (2013.01); *H03F 2200/204* (2013.01); *H03F 2200/207* (2013.01); *H03F 2200/336* (2013.01); *H03F 2201/3233* (2013.01); *H04B 2001/0425* (2013.01)

(56) References Cited

U.S. PATENT DOCUMENTS

| | | | |
|---|---|---|---|
| 6,973,138 B1 | 12/2005 | Wright | |
| 8,009,095 B2 | 8/2011 | Schlee | |
| 8,284,860 B2 | 10/2012 | Xu | |
| 8,885,763 B2 | 11/2014 | Ananthaswamy | |
| 2002/0048326 A1 | 4/2002 | Sahlman | |
| 2013/0147538 A1 | 6/2013 | Oh et al. | |
| 2014/0118066 A1* | 5/2014 | Lee | 330/149 |
| 2014/0161207 A1* | 6/2014 | Teterwak | 375/297 |

OTHER PUBLICATIONS

Lee, Dong-U et al., "Hierarchical Segmentation for Hardware Function Evaluation," IEEE Trans. on VLSI Systems, vol. 17, No. 1, Jan. 2009.

Kuckreja, Ajay, "Digital RF Modulators for CCAP," Internet. Available at http://www.cedmagazine.com/articles/2012/08/digital-rf-modulators-for-ccap, Aug. 20, 2012.

* cited by examiner

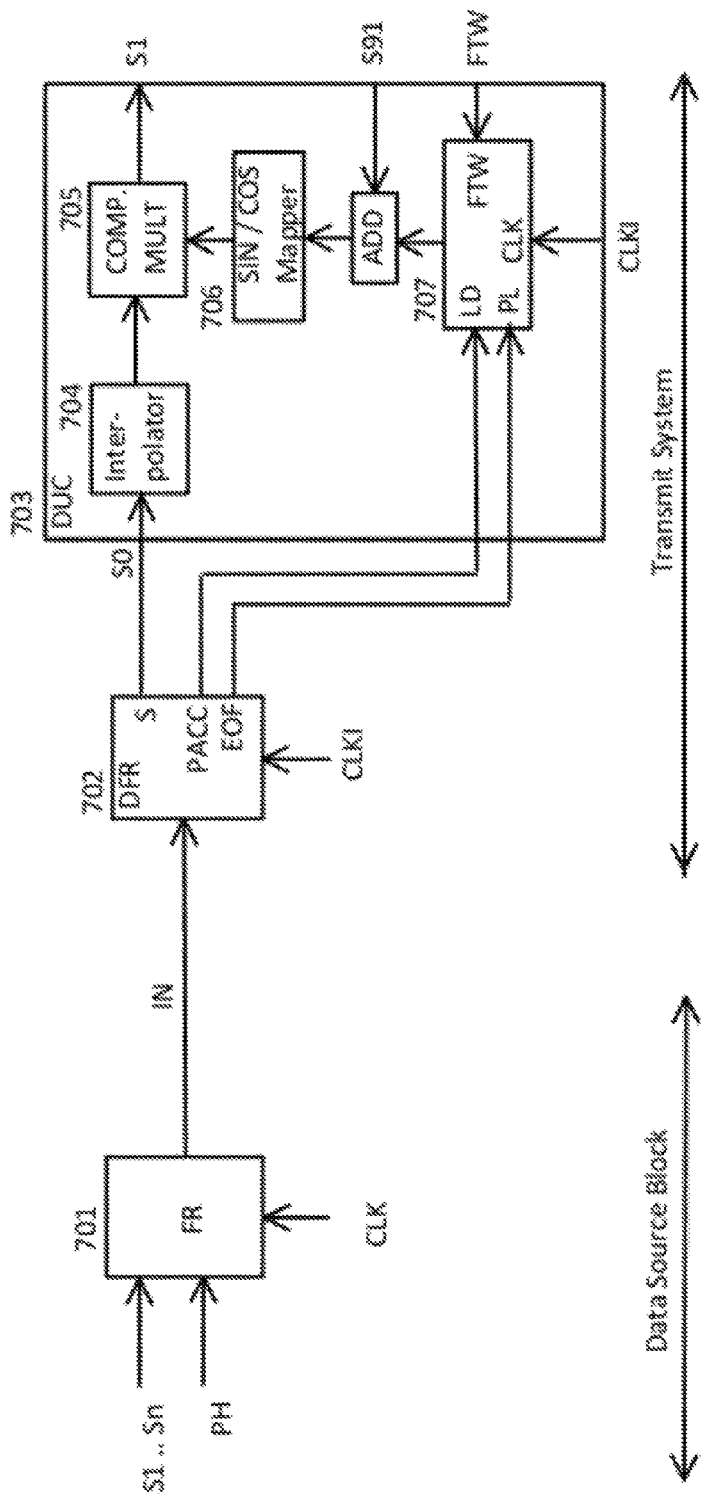
Fig. 7
Fig. 7.a
Frame structure of signal IN

METHODS, DEVICES, AND ALGORITHMS FOR THE LINEARIZATION OF NONLINEAR TIME VARIANT SYSTEMS AND THE SYNCHRONIZATION OF A PLURALITY OF SUCH SYSTEMS

CROSS REFERENCE TO RELATED APPLICATION

This application claims the benefit of U.S. Provisional Patent Application No. 61/825,030 filed on May 18, 2013, the contents of which are incorporated herein by reference.

FIELD OF INVENTION

The invention relates to the generation and synchronization of multiple radio frequency (RF) signals. More specifically, the invention relates to systems for the digital to analog conversion synchronization and linearization of radio frequency signals as used in, but not limited to, wireless and wired transmission systems, beam forming systems, and active antenna arrays.

BACKGROUND

Modern wireless transmission systems require high linearity, high bandwidth, and high power efficiency to produce radio frequency (RF) signals. The requirements for high linearity and bandwidth are dictated by various wireless communication standards, such Long-Term Evolution (LTE), Wideband Code Division Multiple Access (WCDMA), and Global System for Mobile Communications (GSM). The bandwidth requirements stem from the higher data-rates expected from these systems. A high output frequency range is required to allow for multi-band operation. The power efficiency requirement comes from the demand for lower operating expenses, longer battery life, and simpler cooling systems.

Designing such wireless transmission systems while simultaneously optimizing all these requirements is a difficult task. Currently available building blocks used to design such systems have many limitations. Overcoming these limitations requires the use of sophisticated correction and compensation technics.

One such technic is the digital pre-distortion (DPD) system. An implementation of such a DPD system is depicted in FIG. 1. Many of these DPD systems digitally pre-distort a baseband signal S0 before it is converted in the analog domain and up-converted to RF domain (See FIG. 1).

With the advent of: 1) high speed digital to analog converters (DACs), providing sampling rates well above 10 Giga samples per second (GSPS) and the necessary resolution to generate analog signals in the frequency range from DC to several GHz; and, 2) deep sub-micron complementary metal-oxide semiconductor (CMOS) processes allowing for power efficient signals processing, wireless transmission systems can be built completely in the digital domain, i.e. the frequency up conversion using a digital up converter (DUC) and the digital pre-distortion (DPD) can be performed in the digital RF domain as shown in FIG. 2.

Pre-distorting the signals in the digital RF domain has many advantages over baseband pre-distortion systems. First, imperfections of the analog modulator, such as clock feedthrough and image suppression, which need additional compensation efforts, do not exist. Second, the RF signals in the digital domain can be generated arbitrarily perfect, limited only by the quantization accuracy used to represent the involved signals. Third, the range, flexibility, and stability of operations and functions necessary to perform the pre-distortions is easier implemented in the digital domain compared to the analog domain. However, even in advanced low power deep sub-micron CMOS processes, operating digital systems at clock frequencies of several GHz demand efficient implementations of the DUC and DPD in order to stay within a given power budget.

Also, the implementation of the DPD must be flexible enough to compensate for all kinds of distortion effects a wireless transmission system might exhibit. Such distortion effects might include, nonlinear static transfer functions, nonlinear dynamic transfer functions, memory effects, and hysteresis effects.

Another requirement for wireless transmission systems is the synchronization of multiple individual wireless transmission systems. Active antenna arrays and beam-forming applications rely on synchronization. In embodiments of the subject invention, the term "synchronization" in this context means that the individual wireless transmission systems generate substantially the same output given the same input.

In order to achieve this, the digital subsystems (DUC and DPD engines) must be synchronized. In embodiments of the subject invention, an Engine comprises any electronic circuit that produces output signals based on a set of input signals and internal signals. The DUC includes an internal phase accumulator which gets incremented at every clock cycle. The phase accumulator is a system with an internal state. In embodiments of the subject invention, an internal state comprises the status of internal signals at any given time within a system that operates on input signals and internal signals to produce output signals. In order to achieve synchronizations, these internal states have to be synchronized. After the digital subsystems are synchronized, the remaining analog parts (DAC, power amplifier (PA), coupling element (CP)) have to be aligned. In general, only the output power and output phase of the individual subsystems are aligned.

In embodiments of the subject invention, the term "substantially" is defined as at least close to and can include a given value or state, as understood by a person of ordinary skill in the art. In one embodiment, the term "substantially" refers to ranges within 25%, preferably within 5%, more preferably within 1%, and most preferably within 0.1% of the given value or state being specified.

SUMMARY OF THE INVENTION

There are additional features of the invention that will be described hereinafter and which will form the subject matter of the claims appended hereto. In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

The subject invention discloses the implementation of a digital pre-distortion in radio frequency (RF) transmission systems. The digital pre-distortion is performed in the RF domain capable of addressing distortion terms of the remaining analog system such as nonlinear static transfer functions, nonlinear dynamic functions, memory effects, and hysteresis effects.

The subject invention also discloses the characterization of the distortion terms by equivalent energy packages and the compensations of these distortion terms by energy packages.

The subject invention further discloses the efficient implementation of the digital pre-distortion using cascaded lookup tables.

The subject invention discloses the reuse of an apparatus and method used for pre-distortion to synchronize a plurality of such transmission systems.

The subject invention also discloses the synchronization of digital subsystems within the transmission system that comprise elements with internal states.

The subject invention further discloses a digital subsystem which does not need a startup sequence to achieve synchronization.

The subject invention also discloses a digital subsystem which has a bound recovery time case of an error condition.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto. There together with other objects of the invention, along with the various features of novelty, which characterize the invention, are pointed out with particularity in the claims annexed to and forming a part of this disclosure.

BRIEF DESCRIPTION OF THE DRAWINGS

Advantages of the present invention will be apparent from the following detailed description of exemplary embodiments thereof, which description should be considered in conjunction with the accompanying drawing:

FIG. 7 is a schematic of the synchronization of the DUC in the digital subsystem.

FIG. 7a is the possible implementation of a frame structure used in the communication between data-source block and the transmission systems.

DETAILED DESCRIPTION

The following will describe, in detail, several embodiments of the present invention. These embodiments are provided by way of explanation only, and thus, should not unduly restrict the scope of the invention. In fact, those of ordinary skill in the art will appreciate upon reading the specification and viewing the present drawings that the invention teaches many variations and modifications, and that numerous variations of the invention may be employed, used, and made without departing from the scope of the invention.

For a conceptual understanding of the invention and its operational advantages, refer to the accompanying drawings and descriptive matter in which there are preferred embodiments of the invention illustrated. Other features and advantages of present invention will become apparent from the following description of the preferred embodiments, taken in conjunction with the accompanying drawings, which by way of example; illustrate the principles of the invention.

Figure 1:
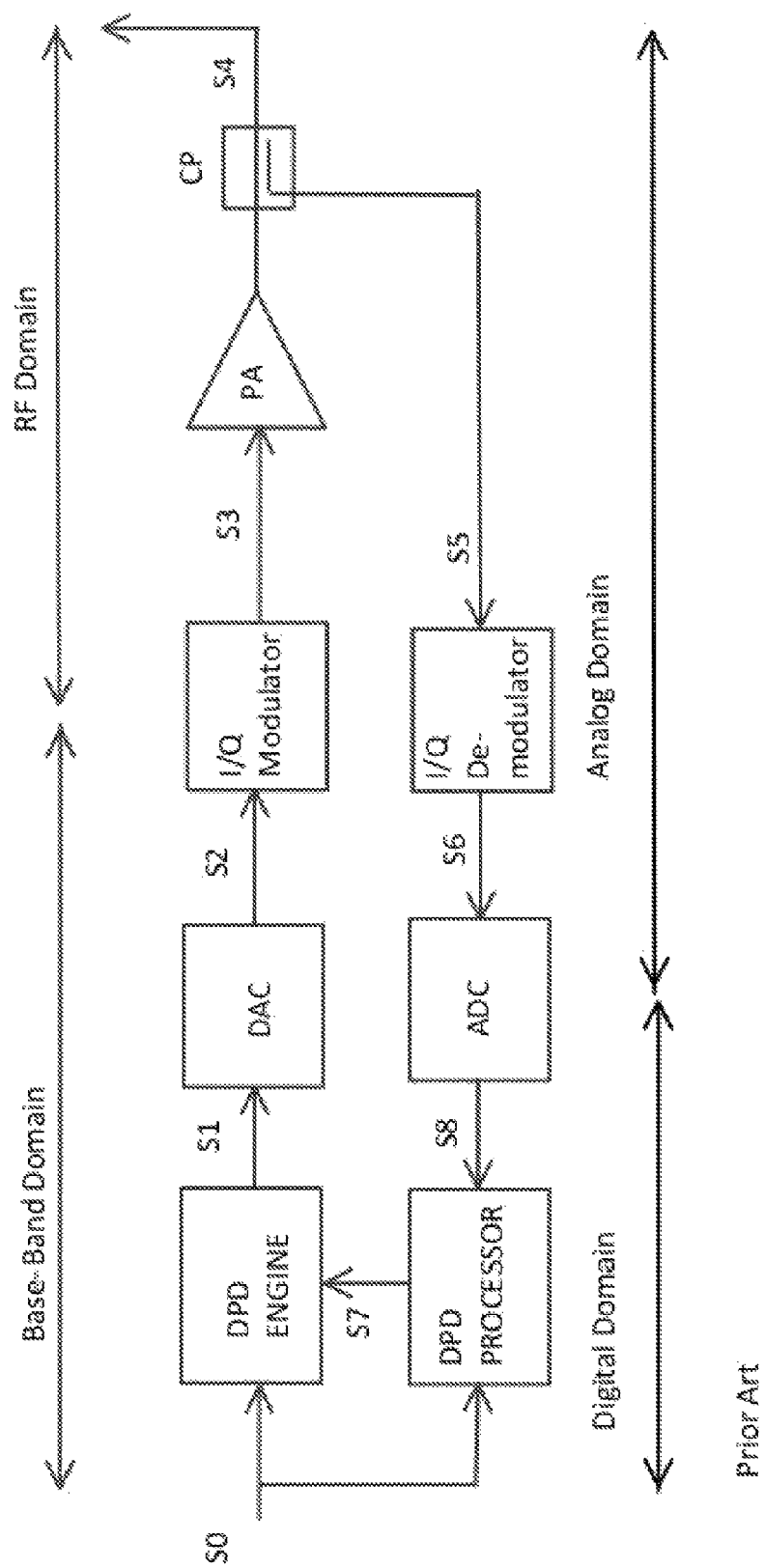
FIG. 1 is a conventional baseband digital pre-distortion (DPD) scheme.
Figure 3:
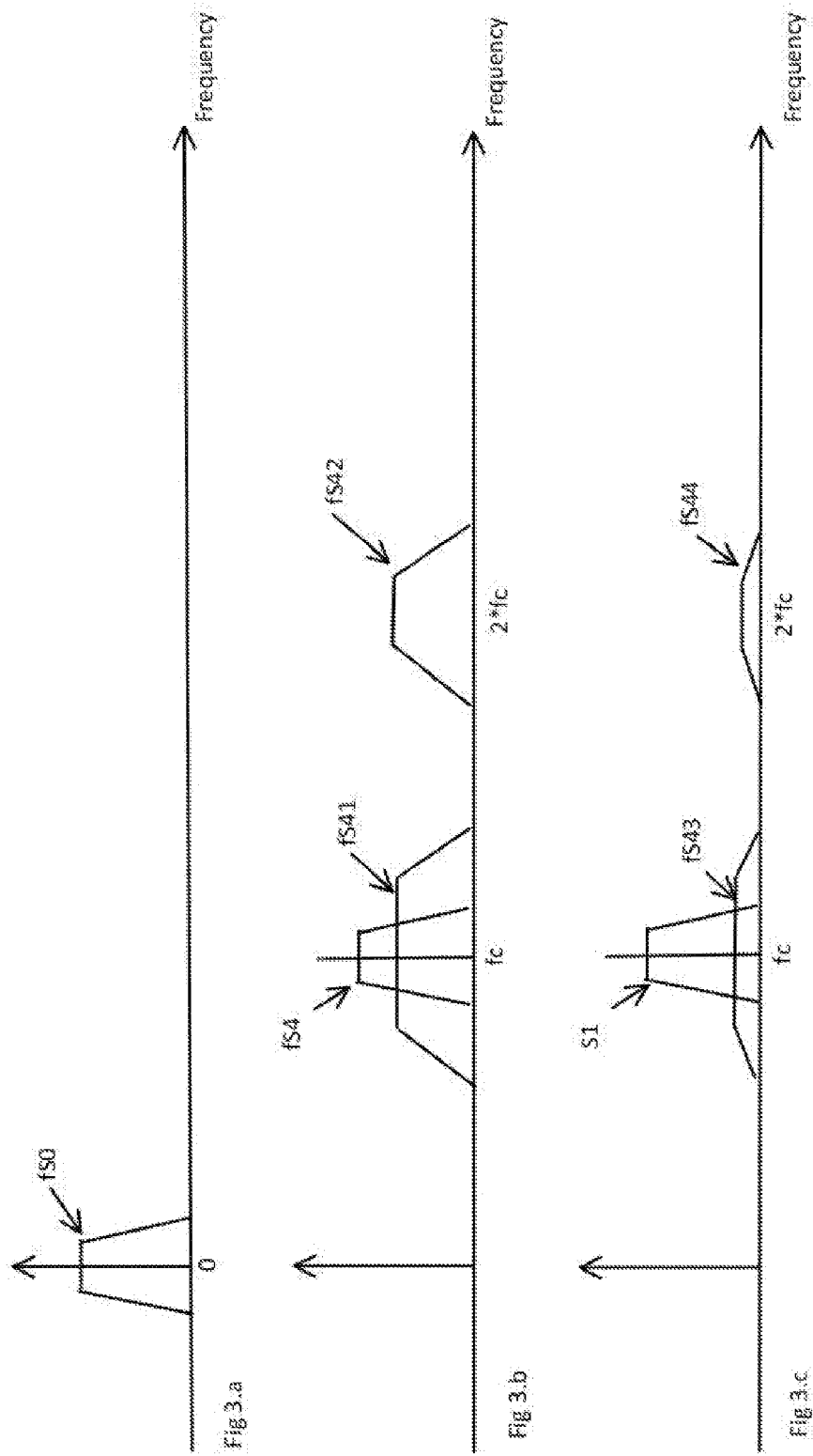
FIG. 3a is a frequency domain representation of the base band input signal S0.
FIG. 3b is a frequency domain representation of output signal S4 and a subset of distortion signals.
FIG. 3c is a frequency domain representation of output signal S4 and a subset of distortion signals after the digital pre-distortion is applied.

FIG. 1 illustrates a conventional design for a radio frequency (RF) transmission system. FIGS. 3a through 3c illustrate the corresponding frequency domain representations of the signals involved. The baseband signal S0 is delivered to the system as a complex vector with the sampling rate (fin). In the digital pre-distortion (DPD) Engine, a compensation signal is added to the S0 signal to form signal S1. The compensation signal is supposed to cancel the distortion terms introduced to the system by the digital to analog converter (DAC), the I/Q Modulator, and the power amplifier (PA). This added compensation signal S1 requires 3 to 7 times the bandwidth of the original signal S0, depending on the distortions which need to be corrected. Following the DPD Engine, the signal S1 is converted from the digital domain into the analog domain signal S2 by the digital to analog converter (DAC) and then up converted to the RF domain signal S3 with the I/Q Modulator. That is, signal S1 is shifted in the frequency domain from baseband to the desired carrier frequency (fc). In the final step, signal S3 is amplified with a power amplifier (PA) to get the desired output signal S4. With the process technology, and digital to analog converter (DAC) technology available today, it is possible to generate a signal S3 in an integrated circuit (IC). The accuracy achieved by such integrated solutions is sufficient to meet the requirements of transmission standards such as LTE. However, todays PA technology is not able to amplify signal S3 to the required power levels of signal S4 with an accuracy compliant with the transmission standards such as LTE.

An ideal power amplifier (PA) would generate signal fS4, as illustrated in FIG. 3b. The nonlinearities of a practical power amplifier add distortion components to the output signal, which are characterized as harmonic distortions (the 2nd harmonic is shown as signal fS42 in FIG. 3b), and intermodulation distortions (shown as signal fS41 in FIG. 3b). There can be many more distortion signals depending on the characteristics of the nonlinearities of the PA. The compound signal fS4+fS41+fS42 is the output of the RF transmission system without an active pre-distortion engine. The task of the digital pre-distortion (DPD) processor is to find a set of parameters for the DPD Engine so that the DPD engine can add compensation signals to fS0 to suppress signals fS41 and fS42. Generally, this operation does not need to completely suppress signals fS41 and fS41. The goal is to reduce the distortion signals fs41 and fS42 to levels to allow residual signals (fS43 and fS44) to pass spectral requirements of various transmission standards as illustrated in FIG. 3c.

In the system illustrated in FIG. 1, not only the power amplifier (PA) adds distortion components, the I/Q modulator generates and add distortion components to the signal too. The most prominent distortion components are carrier feed-through and images opposite the carrier frequency (fc). These distortions have to be corrected, complicating the DPD process.

Figure 2:
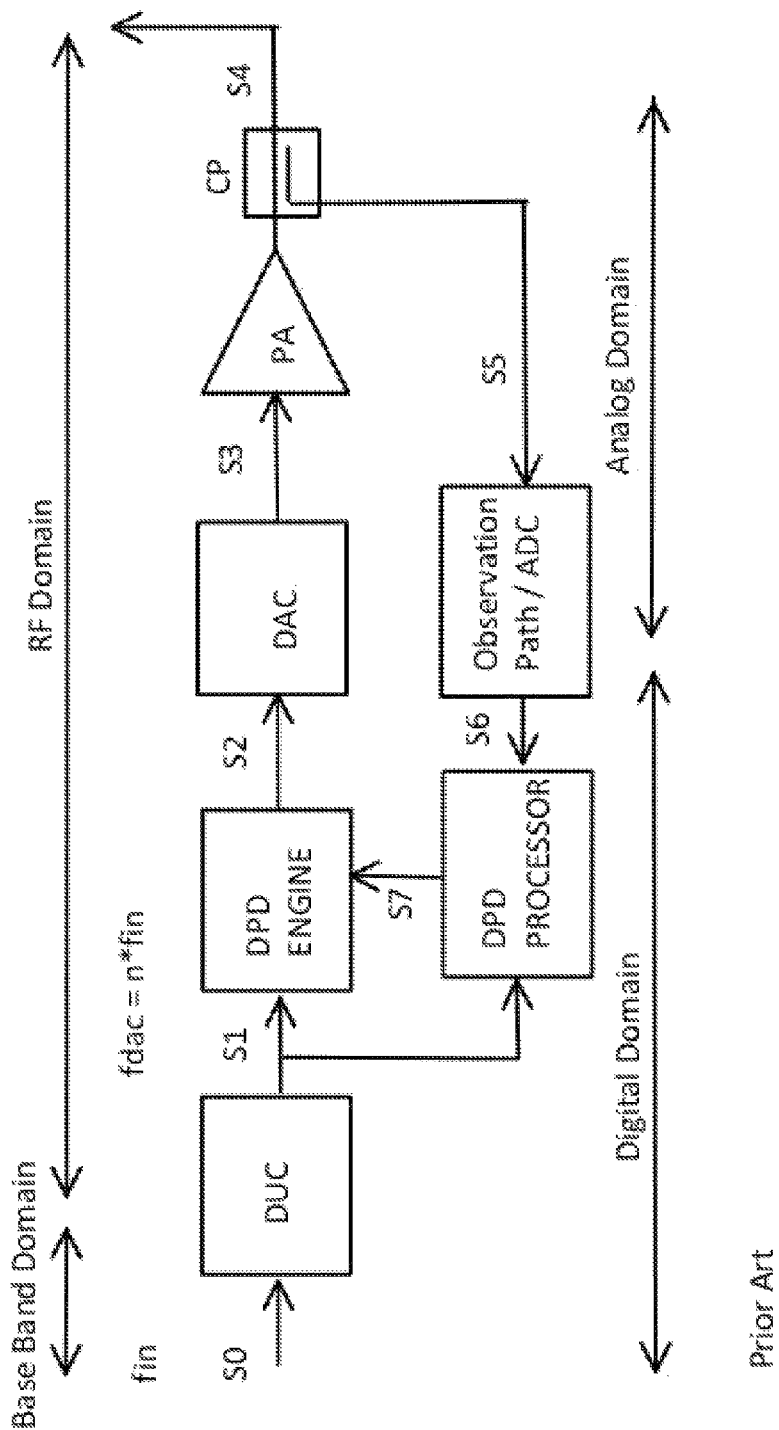
FIG. 2 is a RF domain digital pre-distortion scheme.

FIG. 2 illustrates a RF transmission system capable of suppressing inter-modulation distortions fS41 as well as harmonic distortions fS42, and avoid the signal distortion components introduced by the I/Q modulator. The baseband signal S0 is up-converted into the RF domain in the digital domain using a digital up converter (DUC) to yield signal S1. Distortion components are added to signal S1 using a digital pre-distortion (DPD) engine, yielding signal S2. An analog to digital converter (DAC) brings signal S2 into the analog domain to yield signal S3. Signal S3 is then amplified using a power amplifier (PA) to yield signal S4. Part of signal S4 is coupled out, using a coupling element (CP) to yield signal S5. Except for the power levels, the signal characteristics of signals S4 and S5 are substantially identical.

In the observation path, signal S5 is processed and converted into the digital domain using an analog to digital converter (ADC) to yield signal S6. Signal S6 is then compared to signal S1 in the DPD processor. An error measure computes the differences between signals S1 and S6. Based on the error measure a set of parameters S7 is calculated. Parameters S7 are then sent to the DPD engine. The DPD engine adds distortion signals to signal S1 according to parameters S7. This process is repeated till the error measure of signal S6 reaches a minimum using an algorithm. In embodiments of the subject invention, this algorithm may comprise an iterative learning algorithm.

In the configuration of the system illustrated in FIG. 2, the DPD process is performed after signal S0 has been digital up converted into the RF domain using a digital up converter (DUC) to yield signal S1. During this up conversion process the sampling rate of signal S0 is multiplied by a factor n. Where n is greater than 1. The sampling rate of the signal S1 at the output of the DUC is n time higher than the input sample rate frequency (fin) of signals S0. The frequency range the DPD can compensate for distortions is set by fdac/2, the first Nyquist zone of the DAC. Therefore, using the configuration of the system illustrated in FIG. 2, higher order harmonics and images can be corrected. The minimum sample rate for fdac is set by the highest frequency the transmission system is supposed to generate. Assuming the highest frequency is 3.6 GHz, this requires the fdac to be 2*3.6 GHz=7.2 GHz. However, the operation of the transmission system can be extended to higher Nyquist zone, reducing the requirements for the sampling rate fdac. In this case the DPD engine, DPD processors and observation path have to be reconfigured to operate in the higher Nyquist zones.

In modern CMOS processes, digital to analog converters operating at sampling rates above 10 GSPS are possible. The implementation of the digital up conversion and digital pre-distortion will be competitive in terms of power consumption with modern analog solutions illustrated in FIG. 1.

In order to take full advantage of the DPD engine to correct signals in the first Nyquist zone (0 to fdac/2), the observation path must be able to observe the whole frequency range. One implementation may use an analog to digital converter (ADC) operating at sample rate fdac. However, designing such ADCs with the necessary performance for such applications is difficult. The power consumption of such an ADC would be a significant contributor to the overall power consumption of the system. Also, the input signal conditioning necessary to drive such an ADC would make an integrated solution difficult to realize.

The first part of the present invention describes the hardware configuration of the observation path. The first goal of the subject invention is to achieve the required performance with the technology available today while reducing power-consumption and minimizing the digital signal processing requirements. A second goal of the subject invention is the integration of all components of FIG. 2 into one integrated circuit (IC). Depending on the required output power of the transmission system, integration of the power amplifier might not be possible. In that embodiment of the subject invention, the power amplifier may be an external component and the integrated circuit would provide the necessary input and output signals to control the external power amplifier (PA).

Figure 4:
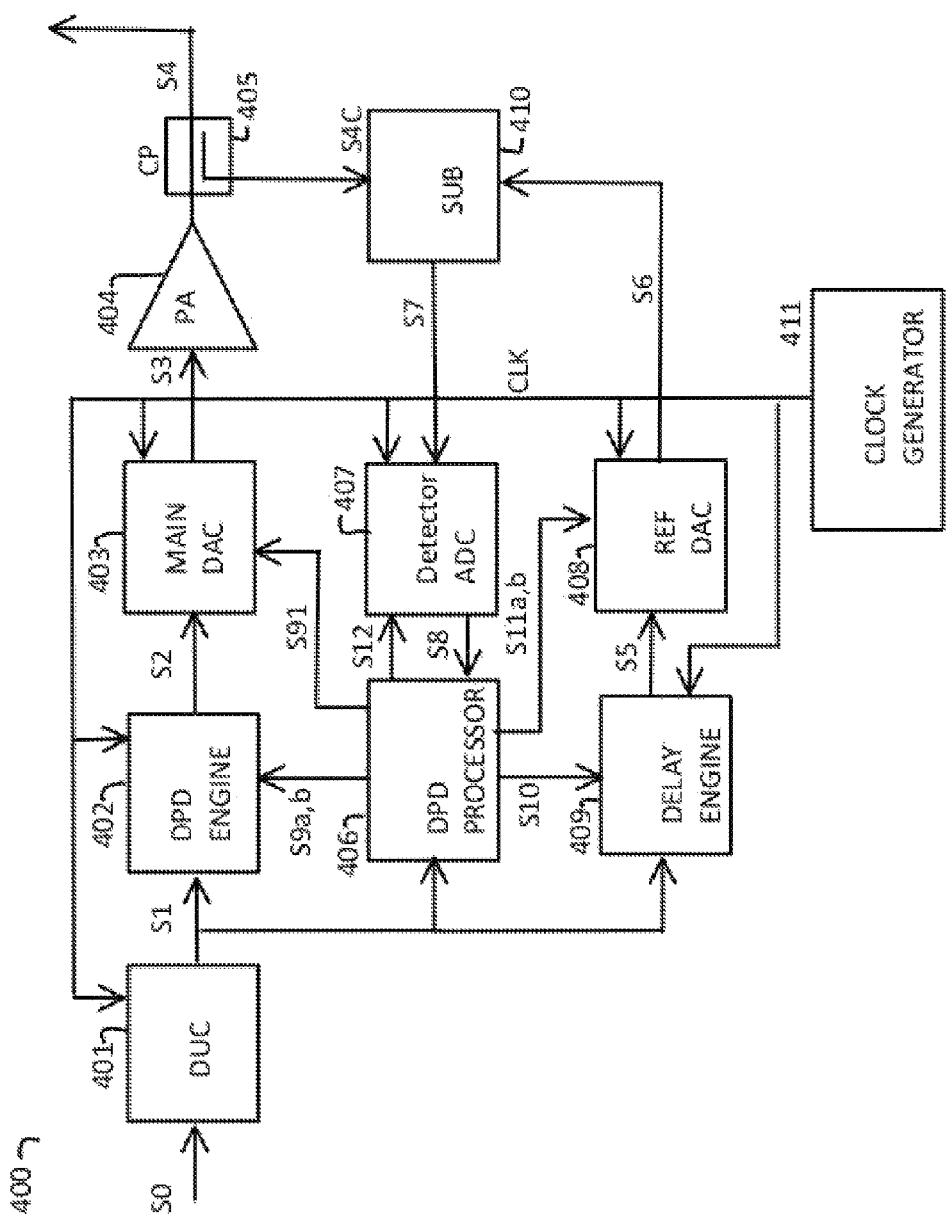
FIG. 4 is a RF transmission system for distortion compensation.

FIG. 4 depicts one embodiment of the hardware configuration 400 of the present invention. The baseband signal S0 is up-converted using a digital up-converter (DUC) 401. The input sample rate frequency of S0 is fin. The output signals of the DUC S1 is at a sampling rate fdac=n*fin, wherein 'fdac' is the frequency of the signal CLK. This sampling rate is the same for all digital to analog converters (DAC) 403, 408, the analog to digital converter (ADC) 407, and the DPD Engine 402. Since the digital up-conversion of signal S0 can be made arbitrarily accurate, signal S1 can be assumed to be essentially distortion free, and therefore can be used as a reference signal.

Signal S1 is passed through the main path which comprises DPD engine 402, then DAC 403, and then PA 404 to generate output signal S4. Part of signal S4 is coupled out to yield signal S4C using a coupling element (CP) 405.

In the first pass the DPD engine will not modify signal S1. Therefore, signal S4 will have all distortion terms added by the DAC 403 and the PA 404. At the same time signal S1 will go through the reference path comprised of a Delay Engine 409 and a Reference DAC 408.

The distortion compensation operation can be split into two steps. In the first step, the signal S6 and S4C are aligned in phase and amplitude. In the second step, the distortion terms of signal S4 are removed.

In the first step, the DPD processor 406 will adjust the DPD engine 402, the main DAC 403, the delay engine 409, and the reference DAC 408 such that signals through the main path of signal S4C and the signals through reference path of signal S6 meet at substantially the same time at subtraction block 410.

The subtraction block 410 generates the difference of signals S4C and S6 to yield signal S7. The detector ADC 407 converts the difference signal into a digital signal useful to the DPD processor 406. The DPD processor 406 computes the time alignment signals S10, S9a, S91, and S11a; and the amplitude alignment signal S11b.

In the second step, the DPD processor 406 computes the DPD Engine parameters S9b using an algorithm. In embodiments of the subject invention, this algorithm may comprise an learning algorithm. There is a trade-off between the complexity of the detector and the complexity of the algorithm. In one embodiment, the detector ADC may be reduced to an RMS detector or a peak detector. However, the information extractable from such a signal would be limited and could lead to ambiguities in the execution of the algorithm. Using an ADC simplifies the task for the DPD processor to find the correct values for signals S9a, S9b, S10, S11a, and S11b, since the complete error vector over an observation time frame is available.

The requirements for the dynamic range, resolution, and accuracy of such an ADC 407 is significantly reduced since only the error signal S7 has to be quantized. Signal S7 is the difference between output signal S4C and the reference signal S6. Adjusting the input compliance range of the detector ADC 407 dynamically with the DPD processor 406, using signals S12, allows for improved system performance or relaxed accuracy specifications for the ADC. For example, during the amplitude and delay alignment phase of the DPD algorithm, the input range of the ADC would be set to a high value since the error signal S7 is expected to be high. Once the signals S4C and S6 are aligned the error signal S7 will become very small. Re-adjusting the input range of the ADC effectively improves the absolute resolution of the ADC, which makes it possible to further improve the alignment of the signals S4C and S6, or extract the distortion components introduced by the main path.

In the second step, after the alignment phase, the DPD processor 406 analyses the distortion components of signal S7 and adjusts the DPD Engine parameter S9b such that the error measure on signals S7 and S8 is a minimum. This can be achieved using an algorithm executed by the DPD Processor 406. In embodiments of the subject invention, this algorithm may comprise an iterative learning algorithm or a learning algorithm.

The overall system performance hinges on the quality of the reference signal S6 generated by the reference DAC 408. Signal S6 is an internal low power signal terminated by a well-defined load presented by the subtraction block (SUB) 410.

The system illustrated in FIG. 4 makes the design of a high quality reference digital to analog conversion 408 possible. The quality of reference DAC is limited by the matching performance of the DAC itself and coupling interactions between the reference DAC 408 and the rest of components in the system 400. Distortions introduced to signal S6 must be kept small compared the expected distortion components of signals S4 and S4C.

One embodiment of subtraction block 410 is a Kirchhoff current node, assuming signals S6 and S4C are represented in the current domain. Other exemplary embodiments may include active circuitry such as an operational amplifier.

One advantage of the present invention is that the system requires only one clock frequency. The main DAC 403, the reference DAC 408, and the detector ADC 407 all operate on the same clock frequency as illustrated in FIG. 4. Prior art systems, like the one illustrated in FIG. 1, require at least two different clock frequencies. One clock signal to operate the digital to analog converter (DAC) and the analog to digital converter (ADC), and another clock signal to operate the I/Q modulator and demodulation. Clock interference in such prior art systems, and the resulting performance degradation, is a problem that is usually solved with a carefully designed frequency plan. However, the request for more frequency agile systems as required for software defined radios (SDR) applications makes the design of such systems difficult. Since the present invention requires only one clock signal, which is at a higher frequency then the output signals, the problems of clock interference are avoided.

Another advantages of the present invention is that the necessary building components can be integrated into modern CMOS processes, with the exception of the power amplifier (PA) which can be internal or external. All other building components of the invention are well understood in the industry and already available in an integrated form.

In embodiments of the subject invention, the algorithm implemented in the DPD processor to achieve alignment of the reference signals with the transmission signal, and subsequently the compensation of the distortion errors can be based on iterative gradient decent methods or other learning algorithms.

Synchronization of RF Transmission Systems

Figure 6:
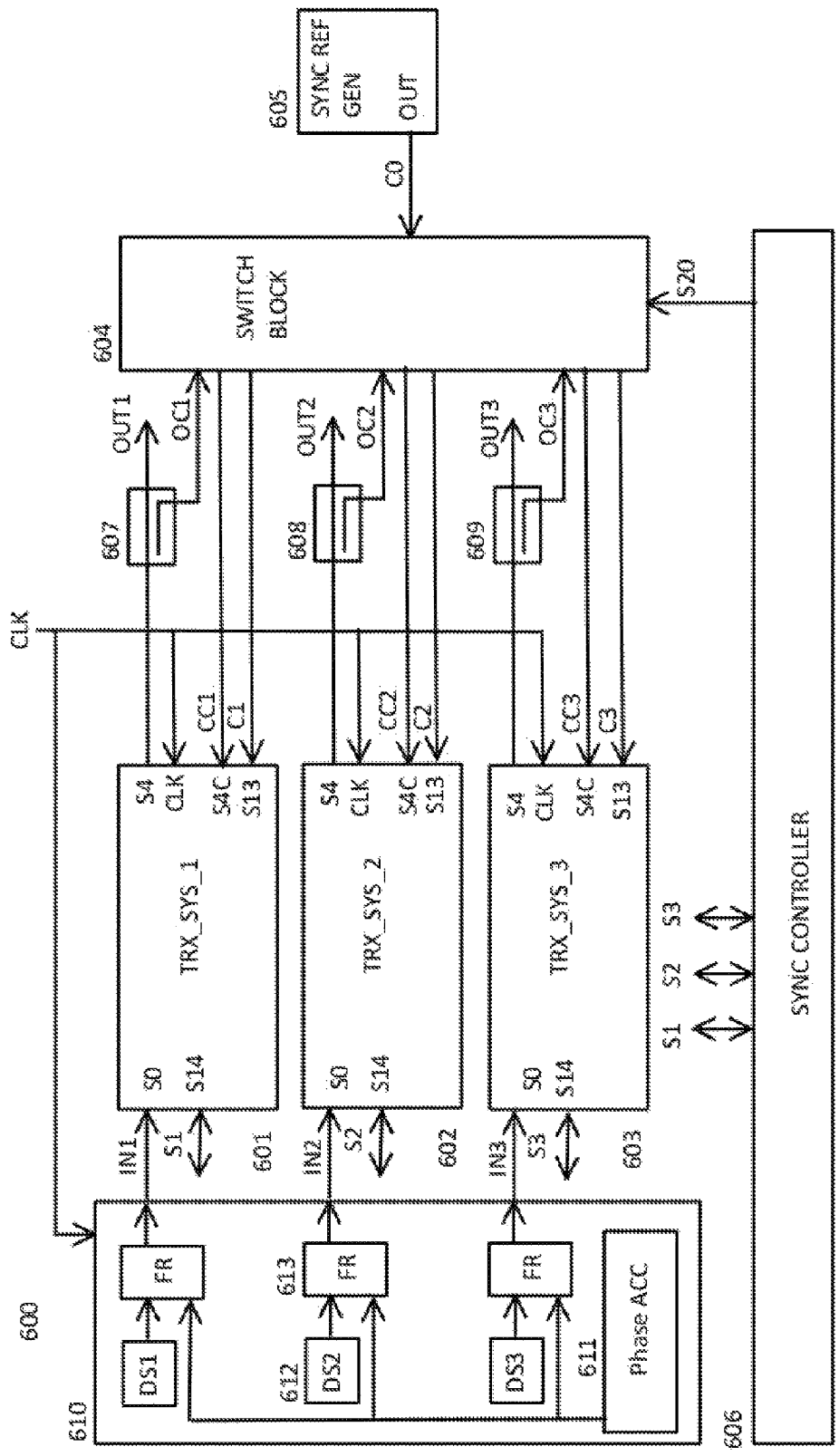
FIG. 6 is a schematic of multiple synchronized RF transmission systems.

In some applications, it is necessary to synchronize multiple RF transmission systems. Active antenna array systems and beam-forming systems are examples of such systems. FIG. 6 illustrates such a system with three individual RF transmission systems 600.

The present invention is not limited to three individual RF transmission systems. Any number of RF transmission systems can be synchronized with the subject invention. However, for simplicity only three RF transmission systems are illustrated. Also, FIG. 6 is a generalized diagram which illustrates many possible embodiments of the synchronization system.

In an ideal case, all individual RF transmission systems behave exactly the same. That is, input to output transmission characteristics of the individual RF transmission systems are the same. However, due to different signal propagation delays in the DAC and the PA caused by part to part delay and gain variations of these components, timing skews of the CLK signals at the CLK terminals of the transmission systems TRX_SYS1 to TRX_SYS3 contribute to synchronization errors. Synchronization in this context is best described as follows: if the same digital signal is applied to the individual RF transmission systems, all RF transmission systems will produce output signals substantially identical in phase and power. To overcome variations in the individual RF transmission systems, calibration technics have to be applied to achieve synchronization.

Figure 5:
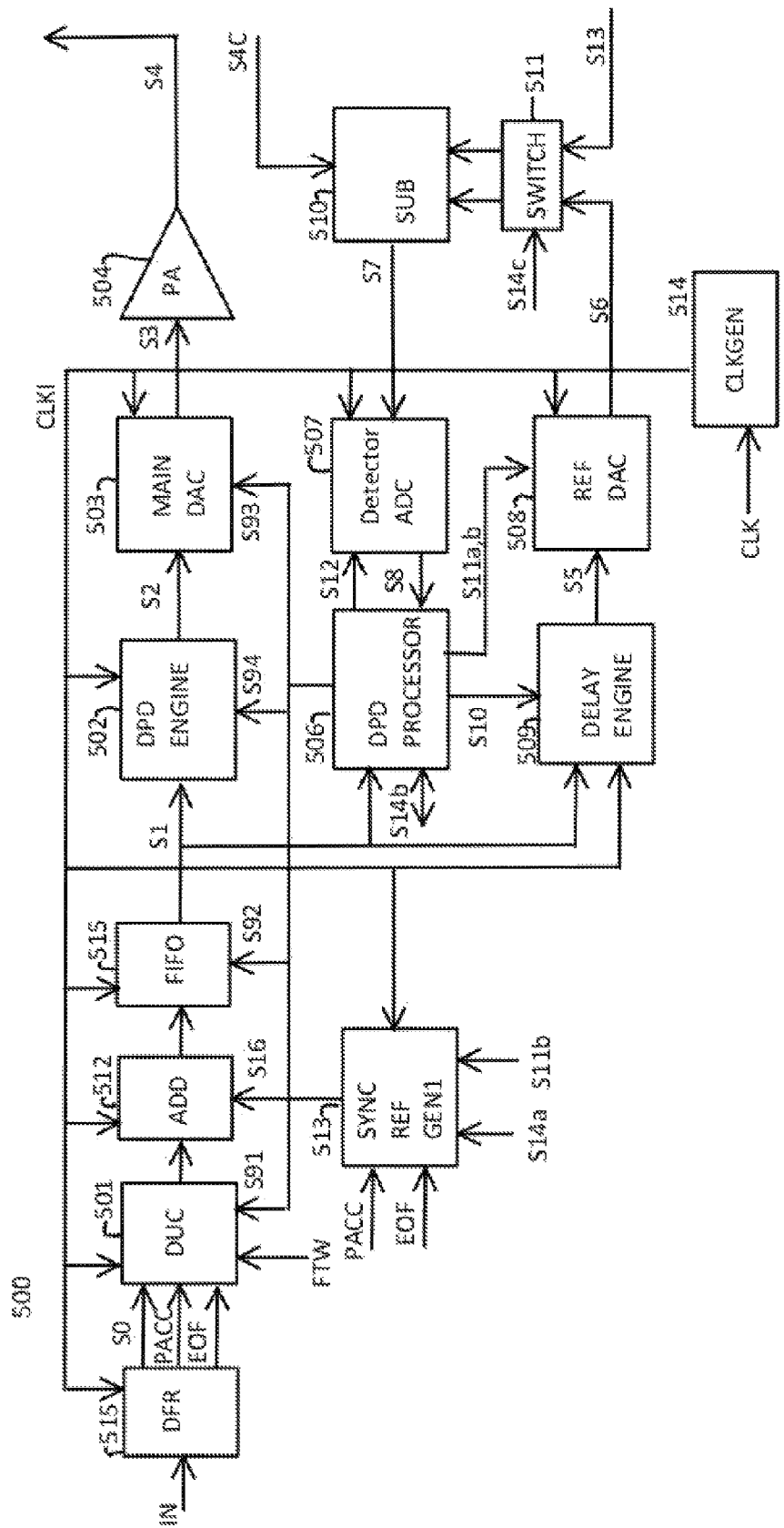
FIG. 5 is a RF transmission system for distortion compensation and synchronization.

FIG. 5 illustrates an embodiment of an RF transmission system with calibration capability. The synchronization reference generator 513 generates a reference signal S16 which can be added to transmission signal using adder 512. The synchronization reference signal S16 can be activated or deactivated by signal S14a. If the synchronization generator 513 is deactivated, signal S16 is set to zero, i.e. the transmission signals are not altered. The switch 511 can route signals S6 and the externally applied synchronization reference signal S13 to the subtract block 510 at the same time (mode1) or time inter-leafed (mode2) depending on the state of signal S14c. Also depending on signals S14c, Signal S7 is computed as S7=S4C−S6−S13 for S15 in the first state; or S7=S4C−S6 in the second state; or S7=S4C−S13 in the third state. The DPD processor 506 can adjust the delay of the main path, the signal path from signal S0 to signal S4, by adjusting the delay in the FIFO 515, the main DAC 503, or at the phase accumulator of the digital up-converter 501. The control signals for these operations are S91, S92, and S93.

Phase synchronization of the RF transmission system requires that the digital signal S2, the output of the digital sub system, produces the same signal in each individual RF transmission system.

The digital subsystem in the individual RF transmission systems is comprised of the clock generator 514, the de-framer logic 515, the digital up-converter 501, the adder 512, the FIFO 515, the DPD engine 502, the synchronization reference generator 513, and the delay engine 509.

Since, the digital up converter 501 has a build in phase accumulator 707 (i.e. a system with internal states (memory)), it must be guaranteed that all phase accumulators have the same internal states in relation to the supplied input data 'IN'.

After synchronization of the digital subsystems is achieved, the output signals S4 of the individual RF transmission systems can be aligned.

Major contributors of the alignment errors are the DAC 503 and the PA 504, as well as the timing errors of signals CLK in the individual RF transmission systems. These errors can be addressed with a calibration technics, comparing reference signals to a similar signal routed through the main path of the system.

The technics to detect phase synchronization are similar to the technics used for distortion compensations and the same hardware components can be reused for this task. To compensate for phase synchronization mismatch, control signals S91, S92, and S93 can be used. Signal S92 is a coarse adjust. The resolution of signal S92 is the period of CLKI.

With control signal S93 fine adjustments can be made into the pico second range using analog delay lines in the clock path of the digital to analog converter 503. Digital solutions are also possible using a delay filter.

In some embodiments of the subject invention, it is possible to adjust the phase of signal S4 by changing the phase of the NCO in the digital up converter 501 using control signal S91.

Gain mismatch in the power amplifier (PA), the reference mismatch of the Digital to analog converter, and mismatches of the digital to analog converter can cause variations in the output power of individual RF transmission systems. In the present invention, the DPD engine may be used to compensate for these mismatches, using control signal S94. However, this mismatch errors can also be addressed within in the respective blocks using additional control signals.

Using the present invention, many different methods can be used for calibration. The calibration can be performed in the time domain or in the frequency domain. The system can be calibrated in reference to an 'absolute' signal, meaning the signals are solely generated for calibration purposes or in reference to a 'relative signal', meaning the output signal of a dedicated transmission system is declared the master signal and all other RF transmission systems are calibrated to match the characteristics of this master signal. The system can be calibrated in 'foreground' mode or in 'background' mode. In foreground mode, the transmission system is taken off-line and the calibration is performed. Once completed, the transmission system is placed back on-line. In background mode, the transmission system is always on-line.

For example, a frequency domain background calibration would be implemented using the synchronization reference generators 513 and 605 to generate similar signals.

The reference signals generated by 513 and 605 occupy a part of the spectrum which is not used by the payload signal (the up-converted signal S0). However, the characteristics of the signal path for the payload signal are similar to the reference signals. Thus, if the reference signals in the individual transmission systems align, the payload signals will align too.

Another example of background calibration using relative signals calibration, would involve a payload signal with a built-in characteristic which makes it possible to extract the necessary calibration information. An example would be a signal with a pilot tone.

The coordination of the synchronization procedure is the task of the sync controller 606. The sync controller 606 activates the control signals S1, S2, S3, and S20 based on a calibration mode. The sync controller 606 coordinates operation with the DPD processor 506 in the individual RF transmission systems using control signals S1, S2, and S3. The sync controller 606 routs signals OC1, OC2, OC3, and C0 to appropriate terminals on the RF transmission systems using control signals S20. The sync controller can be implemented as a state machine using a micro controller.

In the most general form, the switch block is capable of routing all input signals OC1, OC2, OC3, and C0 to all possible output signals CC1, CC2, CC3, C1, C2, and C3.

Depending on the calibration scheme not all switching combinations may be necessary.

In one embodiment of the subject invention, a synchronization reference signal generator 605 generates a reference signal C0 which has the same characteristic as signal S16 generated in the transmission system by the synchronization reference generator 513. The switch block 604 routs signal C0 to terminal S13 of all individual RF transmission systems subject to synchronization, 601, 602, and 603. The switch block 604, can distribute signal C0 so that either derived signals C1, C2, and C3 appear on the individual transmission systems at the same time, or time interleaved such that only one signal of the set C1, C2, or C3 is active at a given time. Which of the previous mentioned methods is used depends on the implementation and number of transmission systems, but is irrelevant for the synchronization method of the present invention.

However, the subject invention requires that the delays from terminal OUT of the synchronization reference generator 605 to the terminal S13 of the individual transmission systems 601, 602, 603 be the same. The switch block also routs signal OC1 to signal CC1; signal OC2 to signal CC2; and signal OC3 to signal CC3. In these embodiments, it is assumed that the synchronization reference generator 513 and the DUC 501 in the individual transmission systems are already synchronized.

In one embodiment the sync ref generator 605 can be implemented using a transmission system like 601.

The synchronization of one individual transmission system to the reference signal C0 is as follows, using transmission system 601 as an example. The procedure is repeated for the remaining transmission systems. The sync controller 606 configures Switch Block 604 to send signal C0 to terminal S13, and signal OC1 to terminal S4C of transmission system 601. The sync controller 606 activates the synchronization reference generator in transmission system 601, which generates signal S16. The sync controller 606 sets the switch 511 so that signal S7 is the difference of signals S4C and S13. The DPD processor 506 will minimize the error measure of signal S7 by adjusting signal parameters of signal S16 and the delay settings of the FIFO 515, the digital up converter 501, and the main DAC 503. The DPD processor 506 can use learning algorithms to find the minimum of the error measure of signal S7. The algorithm will stop once the error measure is sufficiently small. The DPD processor 506 will report the completion of the task to the sync controller 606, and the sync controller will proceed with the calibration of the next transmission system. Meanwhile, the DPD processor will reconfigure the transmission system 601 so that distortion terms can be calibrated.

In another embodiment of the subject invention, the RF transmission systems are calibrated relative to a master transmission system. In this embodiment, it is assumed that at least one aspect of signals IN1, IN2, and IN3 is similar enough so that the delay mismatch can be extracted by comparing signal OC1 with signal OC2; and signal OC1 with signal OC3. In this embodiment, the synchronization reference generators 605, 513, and adder 512 can be removed from the transmission systems 500 and 600.

One of the transmission systems will be declared the master system. All the delay settings S91, S92, S93 in the master system we have default values. There will be no calibration procedure for the master system.

In this example, transmission system 601 is declared the master system. For the calibration of the first slave system 602, the switch block sends signal OC1 to terminal S13 of transmission system 602; and signal OC2 to terminal S4C of transmission system 602. Transmission System 602 is configured by the synchronization processor such that signal S7 is the difference between terminal SC4 and terminal S13. From this point on, the calibration procedure is the same as the previous embodiment.

Figure 6B:
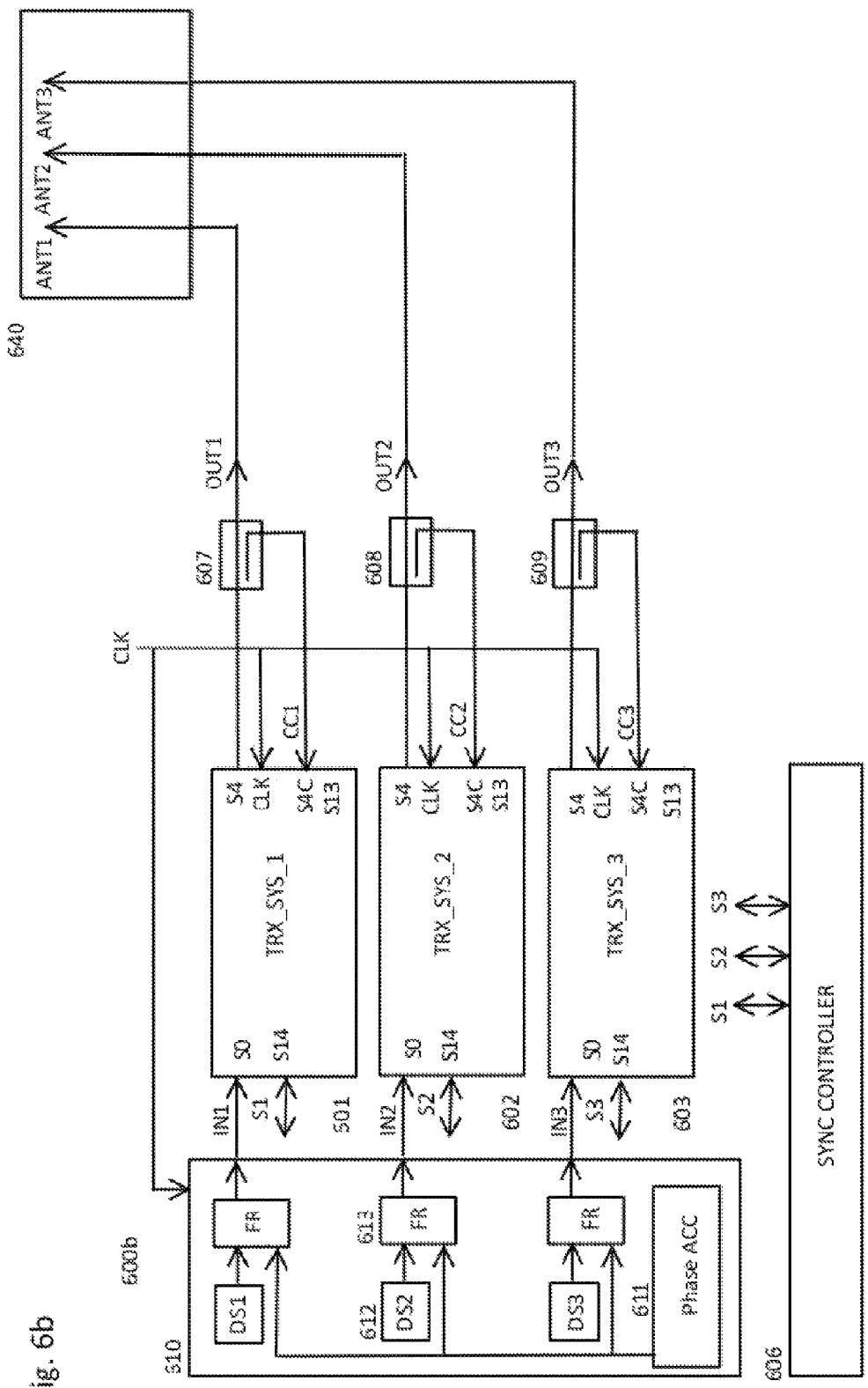
FIG. 6b is a schematic of multiple synchronized RF transmission systems using an antenna array.

FIG. 6b depicts a possible embodiment of the system of FIG. 6 without a switch block 604. Antenna array 640 receives the output signal of the individual transmission systems 601, 602, and 603. It is assumed that the coupling parameters from each antenna element (ANT1, ANT2, ANT3) to each other antenna element is well characterized.

The directional couplers 607, 608, and 609 take the signals coming from the antenna to terminals S4C. All the transmission systems process there respective payload signals. The first transmission system 601 adds a pilot signal to its payload signal using its internal sync reference generator 513. This compound signal is transmitted over ANT1 and received by ANT2 and ANT3.

The received signals of ANT3 are coupled to terminal S4C of system 603. The DPD processor of system 603 calculates a delay value del_13 based on the arrival from the received signals from system 601, and the known delay characteristic of the antenna elements involved. Transmission system 601 removes the pilot signal, and system 602 adds the pilot signal to its payload signal. Now, the DPD processor of system 603 calculates a delay value del_23 based on the arrival from the received signals from system 602, and the known delay characteristic of the antenna elements involved.

The DPD processor of system 603 communicates the delay values del_13 and del_23 to the sync controller 606. The sync-controller 606 communicates the delay corrections to systems 601 and 602. The DPD processors in systems 601 and 602 will adjust the delay of the main signals path accordingly. After this step the delay values del_13 and del_23 are the same and hence systems 603 and 602 are synchronized. The same procedure is applied to the remaining unsynchronized transmission systems.

FIG. 6 depicts the top-level view of one embodiment used for synchronization of the digital sub-system. A data source block 610 generates signals IN1, IN2, and IN3 which are sent to the individual subsystems. The format of the signals IN1, 1N2, and 1N3 can be based on a frame structure. An exemplary frame structure is illustrated in FIG. 7b. The frame can start and end with a marker M1 or M2. D1 to Dn is the payload data generated by the data sources 612. PACC is the phase accumulator value for the digital up-converter. PACC is generated in the data source block 610 and updated with the frame rate (fr_rate). The framer block FR 613, bundles M1, D1 to Dn, PACC, and M2 together and sends the frame to the individual transmission systems.

In the transmission system the de-framer 702 reverses the process. Based on the makers M1 or M2 the frame boundaries are detected. D1 to Dn are extracted and send to terminal S. PACC is extracted and send to terminal PACC. At the end of the frame signal EOF is generated to indicate that all data was received and is valid for further processing. Component 703 is a typical implementation of the digital up converter. The interpolator increases the sampling rate 'fin' of data stream S0 to 'f_dac' the sampling rate of data stream S1. The phase accumulator is clocked with CLKI at a sampling rate 'f_dac'. Every clock cycle the count is increased by the frequency tuning works FTW.

The counter of the corresponding phase accumulator in the data source block 611 is increased with the frame rate (f_frame). The frequency tuning word of 611 is higher by a factor of f_dac/f_frame than the frequency tuning word of the phase accumulator in the transmission systems 601, 602, and 603. This requirement is necessary so that the phase accumulators in the data source block and the individual transmission systems stay synchronized.

At each beginning of a frame the counter of phase accumulator 707 is pre-loaded with the expected phase value computed by 611 in the data source block 610. Signal EOF is used to transfer PACC in the counter 707.

The counter in 707 increments its value again at every clock cycle CLKI by the frequency tuning word. The output of the phase accumulator 707 is mapped 706 to sine and cosine functions, and a complex multiplier 705 multiplies the complex data stream D1 Dn with the sine and cosine to yield the up-converted signal S1.

Timing violations (i.e. setup and hold times) between clock domains CLK and CLKI can be resolved using well established technics like FIFOs, DLLs, or PLLs.

Figure 10:
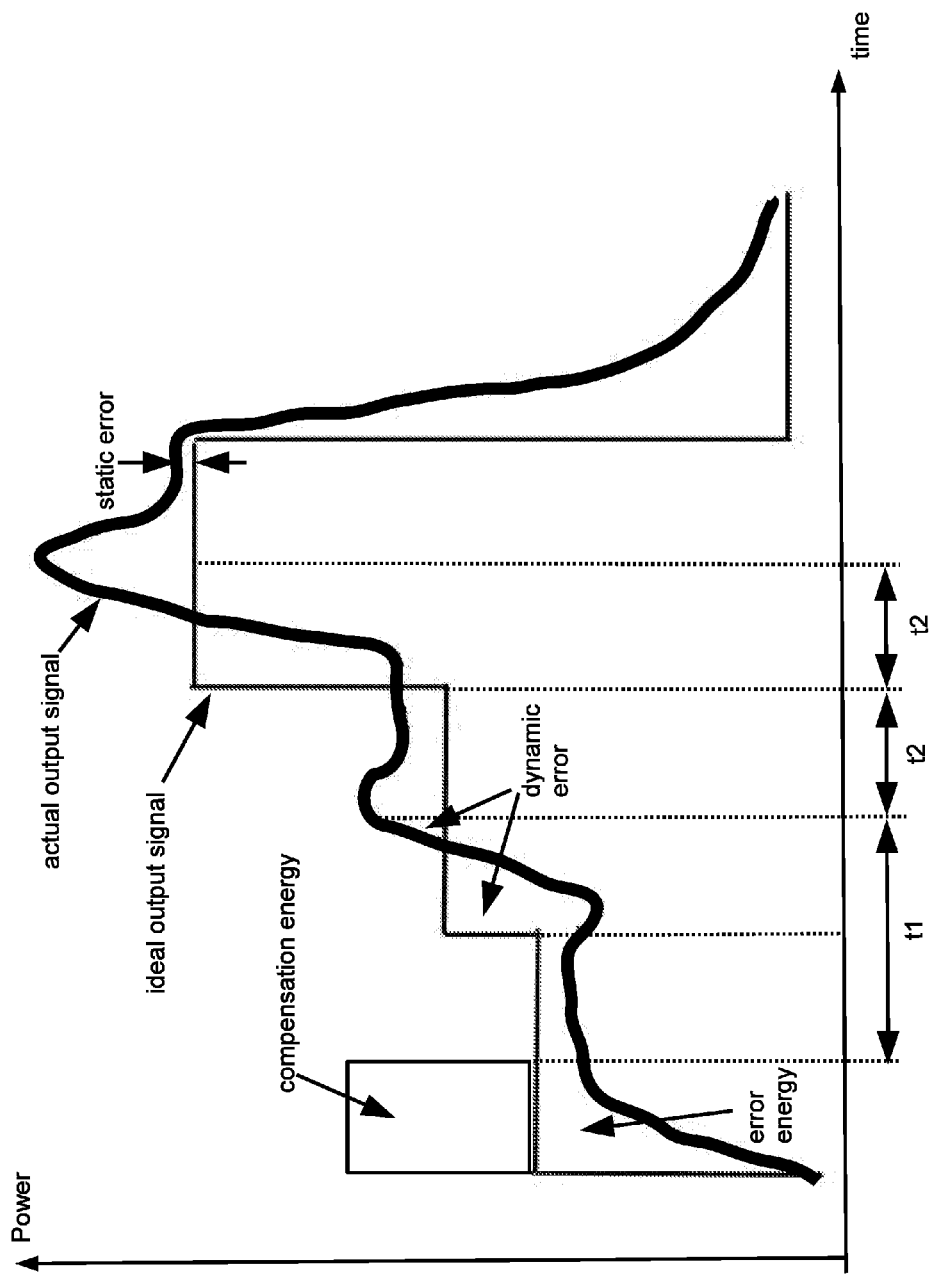
FIG. 10 is a plot of an ideal and actual output signal, illustrating dynamic and static errors

The distortion terms of an transmission system can be modeled by static nonlinear, dynamic nonlinear, memory, and hysteresis effects as illustrated in FIG. 10. The sources of these nonlinearities are related to the components used in the transmission system and the behavior of the environment the components operate within. To compensate for the nonlinearities of the transmission systems, an error model of the systems capturing the dominant error mechanism is implemented. The error model computes error signals based on the input and internal states of the transmission system. The error signals are subtracted from the transmission signals to yield the pre-distorted signal.

For systems illustrated in FIG. 2, where the digital to analog conversion is performed in the RF domain, the correction is straight forward. These errors can be computed as energy packages since the system is updated in fixed time intervals as shown in FIG. 10. The error energy is compensated by adding or subtracting compensation energy package.

In FIG. 10 the solid line displays the ideal output signals with sampling rate t1. The dotted line is an example of the actual output signal of a transmission system including all distortion terms. The area between the solid line and the dotted line, within one time period t2, is the error energy.

t1 is the sampling rate necessary to generate the desired output signal. t2 is the sampling rate of the transmit system. t2 is a fraction of t1. Practical values for t2 are ½ or ¼ of t1. Splitting up t1 into two equal sub interval t2 gives enough flexibility to design compensation charge packages for the first and the second half of t1 so that the frequency domain properties of the resulting pre-distorted signal are sufficient for most applications. Since t2 will not change during the operation of the transmission system, all errors can be expressed as energy packages of constant duration t2.

Figure 9:
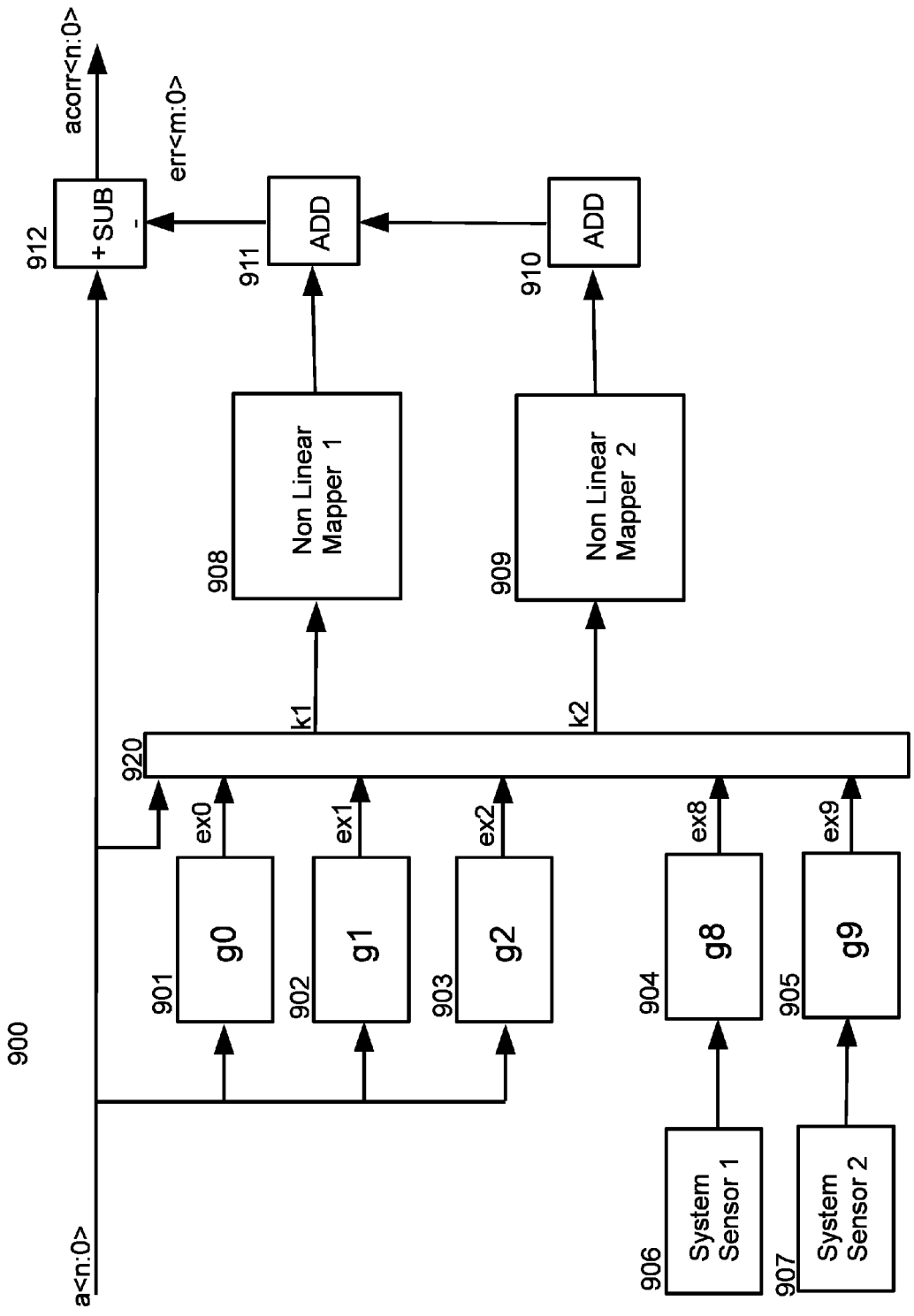
FIG. 9 is a schematic of the DPD engine.

A possible implementation of such an error model is illustrated in FIG. 9.

The input signal a<n:0> is the digital representation of expected output signal of the transmission system. The model calculates a digital signal err<m:0>, which is a digital representation of the distortions the transmission system is expected to produce. Signal err<m:0> is subtracted from signal a<n:0> to yield the pre-distortion signal acorr<nn:0>. Signal acorr<nn:0> is subsequently processed by the analog subsystem of the transmission system. The analog subsystem is comprised of a digital to analog converter and a power amplifier. Since the signal acorr<nn:0> contains the expected errors the analog subsystem will add to the transmission signal a<n:0>, the output of the analog subsystem should be the substantial error free representation of the input signal a<n:0> signal.

The computation the of digital error signal err<m:0> is based on a error model of the transmission system. The errors are also a function of the environment the transmission system is operating within. Examples of such environmental factors include, but are not limited to: temperature, supply voltages, and bias voltages. There are two methods to get a value for these environmental factors. The first method is to measure the environmental factor with a sensor system. The second method is to estimate the environmental factor based on the history of the input signal a<n:0>.

For example, in FIG. 9, the temperature of the transmission system could be measured with a sensor system 906, the signal is converter into the digital domain by means of an analog to digital converter and subsequently processed by computational block g8 904 to yield intermediate variable ex8. The status of the bias system could be predicted by a mathematical model g2 903 based on the history of the input data signal a<n:0>. In order to capture static nonlinear errors, a computational block g0 901 is used to calculate an intermediate variable ex0. In order to capture dynamic nonlinear errors a computational block g1 902 is used to calculate intermediate variable ex1. FIG. 9 depicts computational blocks 901 to 905 which compute intermediate variables ex0 to ex9 for the error model. Based on the complexity of the transmission system there might be more or less intermediate variables necessary to generate a sufficient accurate error model. Based on the dependencies of the effects model by 901 to 905, signals k1 and k2 are formed. Signals k1 and k2 are multi dimensional vectors of size sk1 and sk2, wherein sk1 and sk2 are the number of intermediate signals ex0 to ex9 contributing to signals k1 and k2.

The multi-dimensional vector signals k1 and k2 are the inputs of nonlinear mapper blocks 908 and 909. A nonlinear mapper block computes errors signals based on its input signals. The error signals from nonlinear mapper 1 (908) and nonlinear mapper 2 (909) and are added and subsequently subtracted from the transmits signals a<n:0> to yield signal acorr<nn:0>. FIG. 9 depicts two nonlinear mapper blocks. Depending on the complexity of the transmission system, more or less nonlinear mapper blocks might be necessary to achieve a sufficient accurate error model.

Figure 8A:
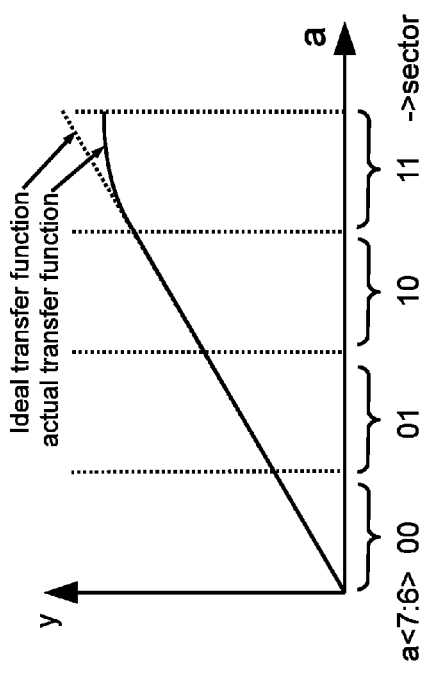
FIG. 8a is a transfer function of a linear and non-linear system.
Figure 8B:
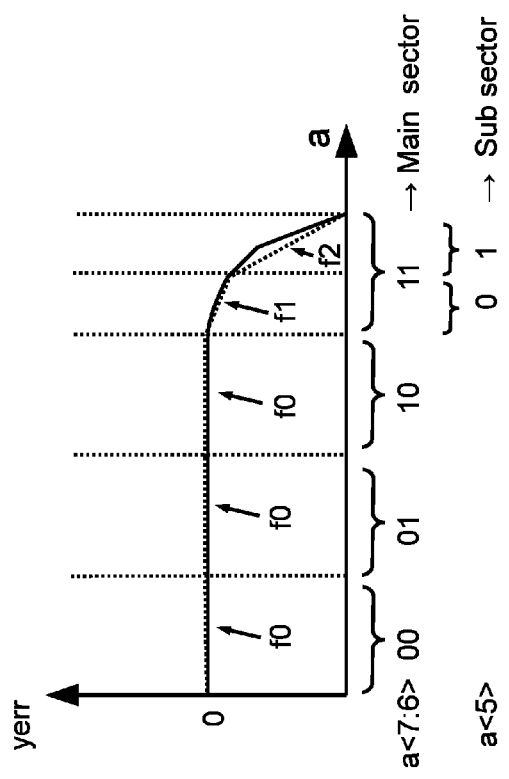
FIG. 8b is a example error function of a nonlinear system and its approximation with a basis function.
Figure 8C:
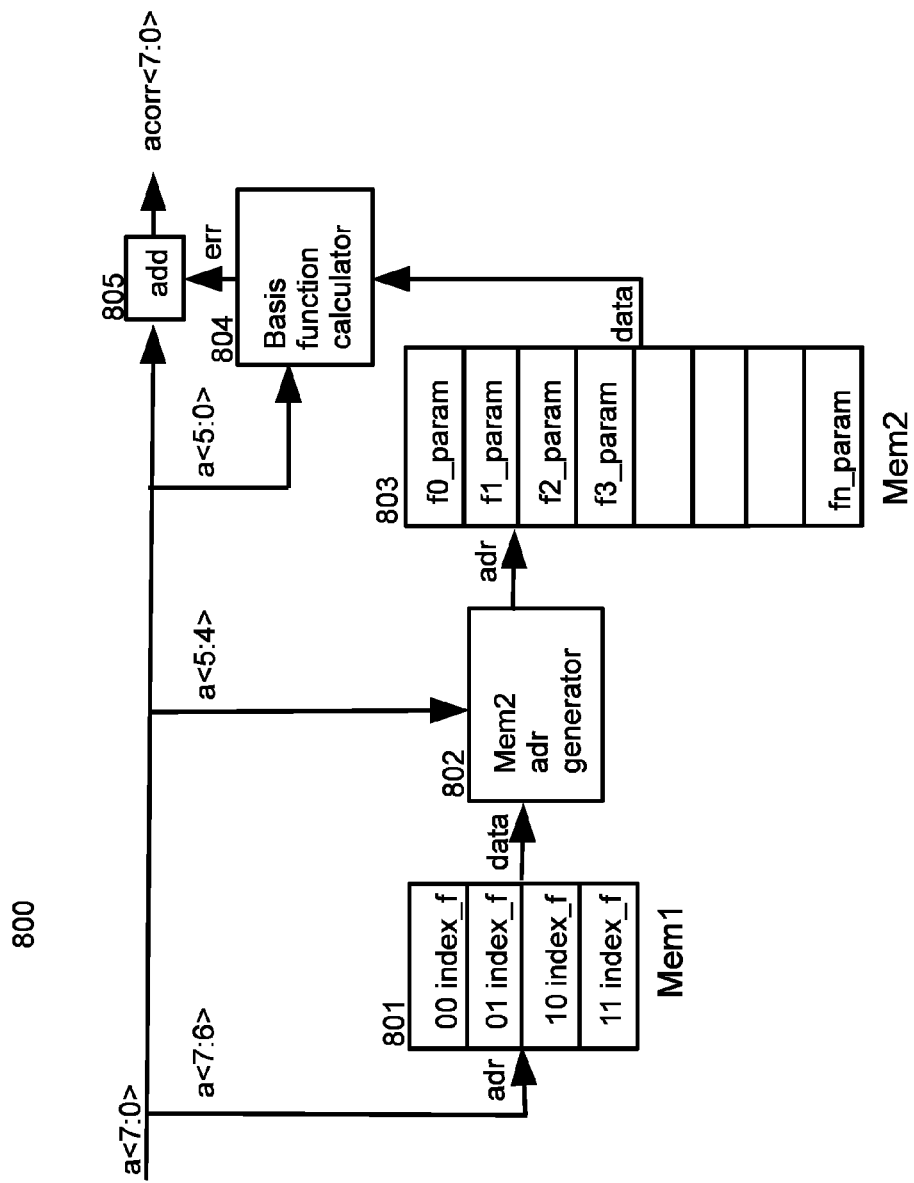
FIG. 8c is a schematic of the Non linear mapper.

FIG. 8C illustrates an implementation of an nonlinear mapper. Since the DPD engine operates at high sampling rates it is important to find an efficient implementation. FIG. 8a illustrates a typical transfer function of a transmission system where 'a' is the input space and 'y' is the output space. For a power amplifier, the 'a' would represent the input power and the 'y' would represent the output power. A common approach is to build a model for the error function 'yerr' which is the difference between the ideal transfer and the actual transfer function.

A common behavior of such transmission systems it that the error function is zero or very small over a very wide operating range and only substantial at the corner or fringe regions, as illustrated in FIG. 8a and FIG. 8b. One aspect of the present invention takes advantage of that behavior. The error is encoded in parameterized basis functions f0 . . . fn. The input space is divided into main sections based on the most signification bits of the input space. If the approximation error of the basis function to the error function is smaller than a given limit, then basis function gets assigned to this section. If the error is bigger than a given limit, then the section is subdivided into two subsections and new basis functions are assigned to the sub sections. This process is repeated till the error between basis function and error functions in all sections are below a given limit.

For example, in FIG. 8b, the input space is 8 bits (a<7:0>) and the basis functions are linear interpolation functions (err=p1*a<5:0>+p0). Parameters p0, p1 are stored as a set (e.g. f0_param) in the look-up-table 803.

The first most significant bits a<7:6> are used to divide the input space into 4 sectors, 00, 01, 10, and 11. For sectors 00, 01, and 10, the error is below the limit and the zero error function f0 (with the parameter set p1=0 and p0=0) is assigned to these sectors. The assignment operation is implemented with a look up table 801. In Sector 11 the behavior of the error functions is very nonlinear and two basis functions have to be assigned. In look up table 801, at location 11_index_f, the parameters for the LUT2 address generator 802 are stored.

The memory address generator 802 calculates the address for lookup table 803 based on parameters 11_index_f and a<5:4>. In the example of FIG. 8, parameter-set 11_index_f would cause the memory address generator 802 to take bit a<5> and add one to it to generate the address for LUT2 (803).

FIG. 8c illustrates the implementation of a nonlinear mapper in a one dimensional space. In general, the nonlinear mapper would be implemented in a multi dimensional space to model the behavior of the error model for dependent variables. In this case the input variable 'a' would be a composed of a subset of the variables set ex0 to exn of FIG. 9.

In FIG. 8c only one basis function calculator 804 is illustrated. However, multiple different basis functions might be desirably fit the error function better. To implement a plurality of basis-functions, the parameter set stored in lookup table 803 could be extended to hold an indicator of the basis-function to be use in the basis function calculator 804. Alternatively, a plurality of systems 800 could be implemented in parallel to achieve a more adaptable nonlinear mapper.

The circuit illustrated in FIG. 9 is a possible implementation of the DPD engine illustrated in FIGS. 4 and 5. In order to extract the parameter for the DPD engine, the DPD processor keeps a record for the transmitted data S1 and collects a record of the error signals S8 it receives from the detector ADC. The DPD processor reshapes the two records to align the transmission data and the received error signals and computes an error measure. Time domain and frequency domain analysis technics can be applied to achieve this goal. Based on the error measure the parameter set of the DPD engine will be adjusted to minimize the error measure. This is achieved using learning algorithms.

The many aspects and benefits of the invention are apparent from the detailed description, and thus, it is intended for the following claims to cover such aspects and benefits of the invention, which fall within the scope, and spirit of the invention. In addition, because numerous modifications and variations will be obvious and readily occur to those skilled in the art, the claims should not be construed to limit the invention to the exact construction and operation illustrated and described herein. Accordingly, all suitable modifications and equivalents should be understood to fall within the scope of the invention as claimed herein.

What is claimed is:

1. A signal processing circuit comprising:
a synchronization reference generator configured to receive a trigger signal and capable in response to the trigger signal of adding an internal synchronization signal to a digital input signal to generate a digital composite RF signal;

a first digital signal processor configured to receive the digital composite RF signal and generate a first digital signal;

a first digital to analog converter configured to receive the first digital signal and generate a RF output signal;

a coupling element configured to receive the RF output signal and generate a derived RF output signal;

a second digital signal processor configured to receive the digital RF input signal and generate a second digital signal;

a second digital to analog converter configured to receive the second digital signal and generate a reference signal;

a subtraction block configured to receive the derived RF output signal and the reference signal, wherein the subtraction block is configured to generate an error signal;

a detector block configured to receive the error signal and generate a digital error signal; and a digital processor unit configured to receive the digital RF input signal and the digital error signal, wherein the digital processor unit controls one or more of the first digital signal processor, the second digital signal processor, the first digital to analog converter, the second digital to analog converter, the subtraction block and the detector block.

2. The signal processing circuit of claim 1, wherein the digital processor unit controls the trigger signal in response to the interference of the internal synchronization signal embedded in the RF output signal and an external synchronization reference signal coupled onto the RF output signal.

3. The signal processing circuit of claim 1, further comprising a clocking block configured to provide a common clock signal to the first digital to analog converter, the second digital to analog converter, and the detector block.

4. The signal processing circuit of claim 1, further comprising: an analog filter, filtering the reference signal before connecting to the subtraction block.

5. A method of linearizing a nonlinear system comprising:
processing a digital RF input signal into a first intermediate signal according to first set of parameters;
processing the digital RF input signal into a second intermediate signal according to second set of parameters;
converting the first intermediate signal into a RF output signal using a digital to analog converter;
converting the second intermediate signal into an analog reference signal using a digital to analog converter;
coupling out a portion of the RF output signal to form a derived RF output signal;
subtracting the derived RF output signal from the analog reference signal to form an error signal;
converting the error signal into a digital error signal using an analog to digital converter;
processing the digital error signal and the digital RF input signal to compute the second set of parameters to substantially align the derived RF output signal with the analog reference signal in the time domain;
processing the digital error signal and the digital RF input signal to compute the first set of parameters to substantially minimize the distortions of the RF output signal.

6. The method of claim 5, further comprising employing an iterative learning algorithm to substantially align the analog reference signal and the derived RF output signal.

7. The method of claim 5, further comprising employing an iterative learning algorithm to substantially minimize the distortion of the RF output signal by adjusting the first set of parameters.

8. The signal processing circuit of claim 1, further comprising: a digital up converter, configured to receive a digital base band signal and up converting the digital base band signal to generate the digital RF input signal.

9. The signal processing circuit of claim 8, further comprising: a de-framer, configured to receive a frame structured signal and generating the digital base band signal and a phase accumulator signal, wherein phase accumulator signal and the digital based band signal are processed by the digital up converter.

10. The signal processing circuit of claim 1, wherein an external synchronization signal is coupled onto the RF output signal causing an interference between the internal synchronization signal embedded in the RF output signal and the external synchronizations signal, and wherein the interference is monitored by the detector block.

11. The signal processing circuit of claim 1, wherein the time domain or frequency domain properties of the digital error signal are used by the digital processor unit to adjust the first digital processor to align the synchronization signal embedded in the RF output signal to be aligned with the external synchronization signal.

12. The signal processing circuit of claim 8, further comprising: a de-framer, configured to receive a frame structured signal and generating the digital RF input signal and a synchronization trigger signal to trigger the synchronization reference generator.

13. The signal processing circuit of claim 8, further comprising:
a de-framer, configured to receive a frame structured signal and generating a digital base band input signal, a synchronization trigger signal and a phase accumulator signal;
a digital up converter, configured to receive the digital base band input signal and the phase accumulator signal generating the digital RF input signal, wherein the synchronization reference generator is triggered by the synchronization trigger signal.

14. The signal processing circuit of claim 1, wherein the detector block is an analog to digital converter.

15. The method of claim 5, wherein the second set of parameters effects only the delay of the second intermediate signal.

16. The method of claim 5, wherein both digital to analog converter converting the first and second intermediate signals and the analog to digital converter converting the error signal operate at the same sampling frequency.

17. A method, performed by a signal processing circuit, for aligning a system output signal to an external reference signal comprising: generating a digital synchronization reference signal; combining a digital input signal with the reference signal forming a digital composite signal;
processing the digital composite signal into a first intermediate signal according to first set of parameters;
processing the digital input signal into a second intermediate signal according to second set of parameters;
converting the first intermediate signal into an analog RF output;
converting the second intermediate signal into an analog RF reference signal;
coupling an external synchronization signal onto the analog RF output signal forming an analog interference signal;

coupling out a portion of the analog interference signal to form a derived interference signal;

subtracting the derived interference signal from the analog reference signal to form an error signal; and converting the error signal into a digital sense signal.

18. The method of claim 17, further comprising the step of: processing the digital error signal and the digital RF input signal to compute the first set of parameters to substantially minimize the distortions of the RF output signal.

19. The method of claim 17, further comprising the step of: processing the digital error signal and the digital RF input signal to compute the first set of parameters to substantially align the synchronization reference signal embedded in the RF output signal to the external synchronization signal.

20. The method of claim 17, further comprising the step of: adjusting the second set of parameters to minimize the digital sense signal.

21. The method of claim 17 further comprising the step of: adjusting the power of the RF output signal by adjusting the first set of parameters in response to the digital sense signal.

22. The method of claim 17, wherein the digital synchronization reference signal and the external synchronizations signal are pilot tones.

23. The method of claim 22, wherein the digital synchronization reference signal and the external synchronization signal are a infrequent waveforms of finite duration.

24. The method of claim 17, further comprising the step of: generating the digital input signal form a digital baseband signal using a digital up-converter.

25. The method of claim 24, further comprising the step of: de-framing a frame based input signal containing a payload signal and a phase accumulator signal using the phase accumulator signals to update the phase accumulator of the digital up-converter and triggering the synchronization reference signal at times associated with the arrival of the frame.

* * * * *